(12) United States Patent
Bayless et al.

(10) Patent No.: US 11,791,212 B2
(45) Date of Patent: Oct. 17, 2023

(54) THIN DIE RELEASE FOR SEMICONDUCTOR DEVICE ASSEMBLY

(71) Applicant: Micron Technology, Inc., Boise, ID (US)

(72) Inventors: Andrew M. Bayless, Boise, ID (US); Brandon P. Wirz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 608 days.

(21) Appl. No.: 16/713,309

(22) Filed: Dec. 13, 2019

(65) Prior Publication Data

US 2021/0183702 A1 Jun. 17, 2021

(51) Int. Cl.
| | |
|---|---|
| H01L 21/78 | (2006.01) |
| H01L 21/50 | (2006.01) |
| H01L 21/683 | (2006.01) |
| H01L 21/67 | (2006.01) |

(52) U.S. Cl.
CPC .............. *H01L 21/78* (2013.01); *H01L 21/50* (2013.01); *H01L 21/67051* (2013.01); *H01L 21/6836* (2013.01); *H01L 21/6708* (2013.01); *H01L 2221/68322* (2013.01); *H01L 2221/68327* (2013.01)

(58) Field of Classification Search
None
See application file for complete search history.

(56) References Cited

U.S. PATENT DOCUMENTS

| | | | | |
|---|---|---|---|---|
| 7,003,899 B1* | 2/2006 | Garcia | .............. | H01L 21/67034 34/570 |
| 7,093,375 B2* | 8/2006 | O'Donnell | ........ | H01L 21/67075 34/79 |
| 7,632,376 B1* | 12/2009 | Ravkin | ..................... | C25D 5/22 156/345.21 |
| 7,727,615 B2* | 6/2010 | Kato | .......................... | C09J 7/38 428/137 |
| 8,384,231 B2* | 2/2013 | Grivna | .............. | H01L 23/49575 257/E21.705 |

(Continued)

OTHER PUBLICATIONS

Matthews Annotated Patent Digest. Chapter 4. Using a Term's "Ordinary" Meaning in Claim Construction. § 4:202. "Workpieces" (2023). (Year: 2023).*

*Primary Examiner* — Erik T. K. Peterson
(74) *Attorney, Agent, or Firm* — Perkins Coie LLP

(57) ABSTRACT

Methods for releasing thinned semiconductor dies from a mount tape and associated apparatuses are disclosed. In one embodiment, a sacrificial layer may be disposed at a back side of thinned substrate including semiconductor dies. The sacrificial layer includes materials soluble in contact with a fluid (and/or vapor). A sheet of perforated mount tape may be attached to the sacrificial layer and an ejection component may be provided under a target semiconductor die to be released. The ejection component is configured to create a locally confined puddle of the fluid under the target semiconductor die such that the sacrificial layer is removed to release the target semiconductor die from the mount tape. Further, a support component may be provided to pick up the target semiconductor die after the target semiconductor die is released from the mount tape.

6 Claims, 5 Drawing Sheets

(56) References Cited

U.S. PATENT DOCUMENTS

| | | | | |
|---|---|---|---|---|
| 8,464,736 B1* | 6/2013 | Lenz | ................ | H01L 21/67017 |
| | | | | 134/108 |
| 2001/0005043 A1* | 6/2001 | Nakanishi | ............. | H01L 23/481 |
| | | | | 257/E23.011 |
| 2001/0055928 A1* | 12/2001 | Eevers | ................ | H01L 21/6836 |
| | | | | 428/343 |
| 2002/0025687 A1* | 2/2002 | Zahorik | .............. | H01L 21/6708 |
| | | | | 257/E23.179 |
| 2002/0125212 A1* | 9/2002 | Mertens | ............ | H01L 21/67028 |
| | | | | 216/57 |
| 2004/0188861 A1* | 9/2004 | Kurimoto | ........... | H01L 21/6836 |
| | | | | 257/786 |
| 2005/0095100 A1* | 5/2005 | Yoo | .................... | H01L 21/6836 |
| | | | | 414/416.09 |
| 2005/0145265 A1* | 7/2005 | Ravkin | ............. | H01L 21/67051 |
| | | | | 134/21 |
| 2005/0148197 A1* | 7/2005 | Woods | ............. | H01L 21/02057 |
| | | | | 438/745 |
| 2005/0170612 A1* | 8/2005 | Miyanari | ........... | H01L 21/6835 |
| | | | | 438/464 |
| 2005/0173064 A1* | 8/2005 | Miyanari | ............ | H01L 21/6835 |
| | | | | 156/755 |
| 2007/0054470 A1* | 3/2007 | Nakamura | ............. | H01L 21/78 |
| | | | | 438/692 |
| 2007/0062644 A1* | 3/2007 | Nakamura | .......... | B29C 63/0013 |
| | | | | 156/707 |
| 2007/0125751 A1* | 6/2007 | Nakamura | ........ | H01L 21/68764 |
| | | | | 216/83 |
| 2008/0079125 A1* | 4/2008 | Lu | ....................... | H01L 23/3735 |
| | | | | 257/E23.09 |
| 2009/0056767 A1* | 3/2009 | Iwata | ........................ | B08B 3/04 |
| | | | | 134/104.4 |
| 2010/0024853 A1* | 2/2010 | Nakamura | ........ | H01L 21/67132 |
| | | | | 134/56 R |
| 2010/0037916 A1* | 2/2010 | Iwata | ................ | H01L 21/02057 |
| | | | | 134/99.1 |
| 2010/0044873 A1* | 2/2010 | Kameyama | ............. | H01L 24/32 |
| | | | | 438/114 |
| 2010/0288311 A1* | 11/2010 | Kholodenko | ..... | H01L 21/67051 |
| | | | | 134/95.1 |
| 2011/0217814 A1* | 9/2011 | Gao | ........................ | H01L 24/19 |
| | | | | 257/E21.599 |
| 2011/0297190 A1* | 12/2011 | Miyanari | .......... | H01L 21/02076 |
| | | | | 134/33 |
| 2014/0217556 A1* | 8/2014 | Peh | ........................ | H01S 5/4087 |
| | | | | 257/620 |

* cited by examiner

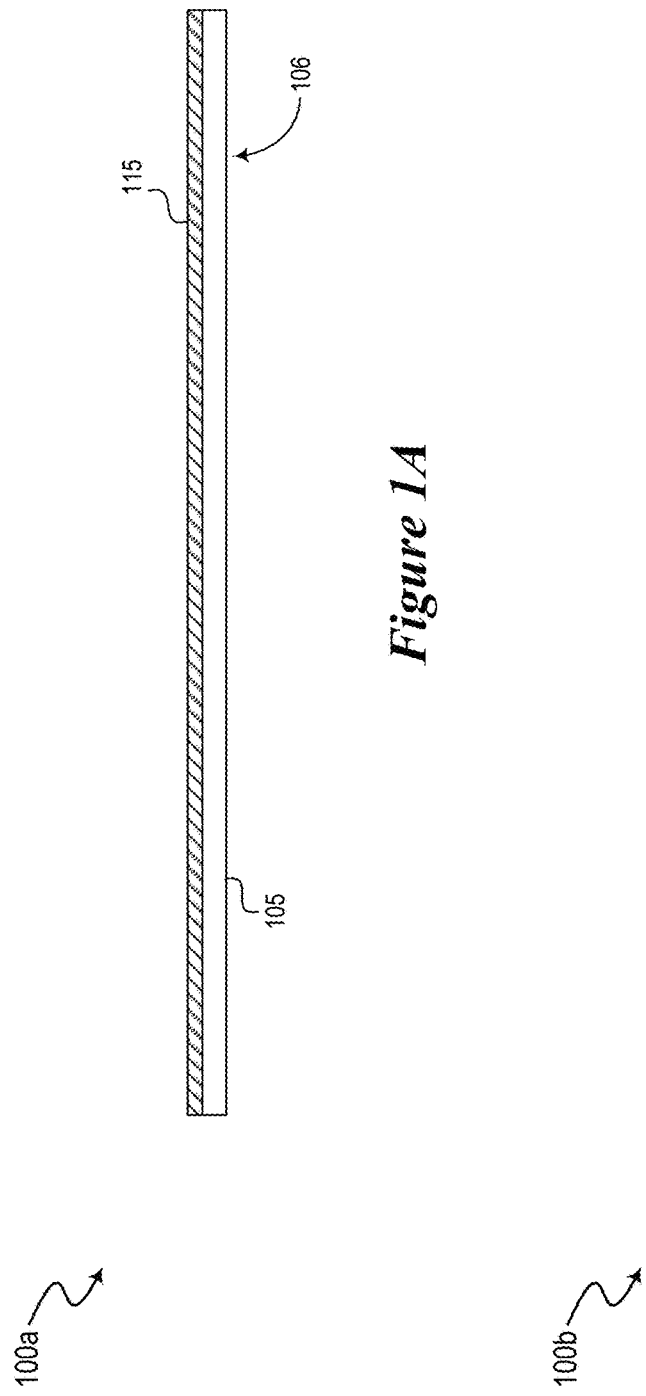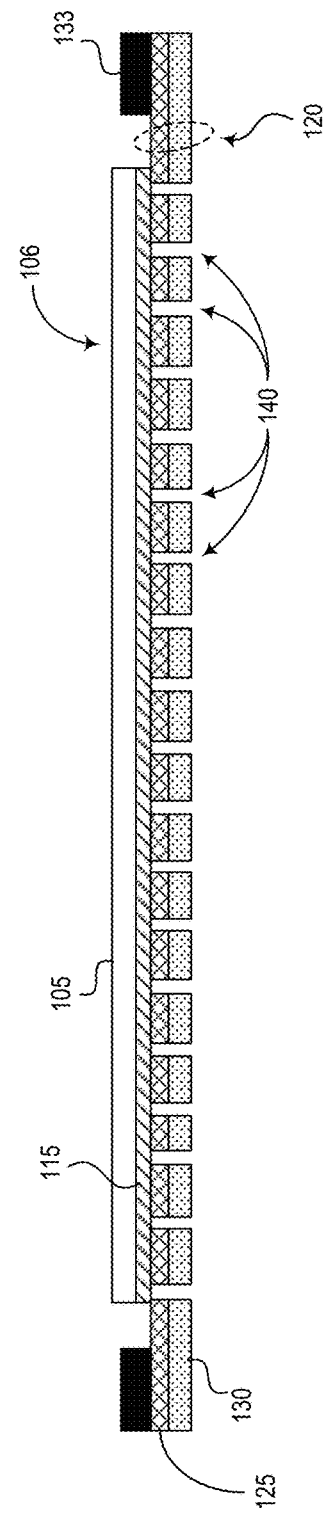

THIN DIE RELEASE FOR SEMICONDUCTOR DEVICE ASSEMBLY

TECHNICAL FIELD

The present disclosure generally relates to semiconductor device assemblies, and more particularly relates to releasing thin dies for a semiconductor device assembly.

BACKGROUND

Semiconductor packages typically include one or more semiconductor dies (e.g., memory chip, microprocessor chip, imager chip) mounted on a substrate, encased in a protective covering. The semiconductor dies may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

In some semiconductor packages, two or more semiconductor dies may be stacked on top of each other to reduce footprints of the semiconductor packages (which may be referred to as multi-chip packages). The stacked semiconductor dies may include three-dimensional interconnects (e.g., through-silicon vias (TSVs)) to route electrical signals between the semiconductor dies. The semiconductor dies may be thinned to reduce overall thicknesses of such semiconductor packages, as well as to mitigate issues related to forming the three-dimensional interconnects through the stacked semiconductor dies. Typically, a sheet of mount tape is attached to a front side of a substrate (e.g., a wafer) having the semiconductor dies fabricated thereon such that the substrate may be thinned from its back side. Further, the substrate may be diced to singulate individual semiconductor dies while attached to an adhesive layer of the mount tape. Subsequently, individual semiconductor dies may be picked up from the adhesive layer—e.g., ejected from the adhesive layer by applying forces. When the substrate (hence the semiconductor dies) is thinned below certain thicknesses (e.g., 50 μm or less), however, the thinned semiconductor dies may easily experience uneven forces sufficient to generate micro-cracks while they are ejected from the adhesive layer. Such micro-cracks may reduce yield or present reliability issues for the semiconductor dies. In some cases, a throughput time of the dicing process may increase to reduce risks of generating micro-cracks as final thicknesses of the substrate further decrease.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

FIGS. 1A through 1D illustrate a process of releasing thin dies for a semiconductor device assembly in accordance with an embodiment of the present technology.

DETAILED DESCRIPTION

Figure 1C:
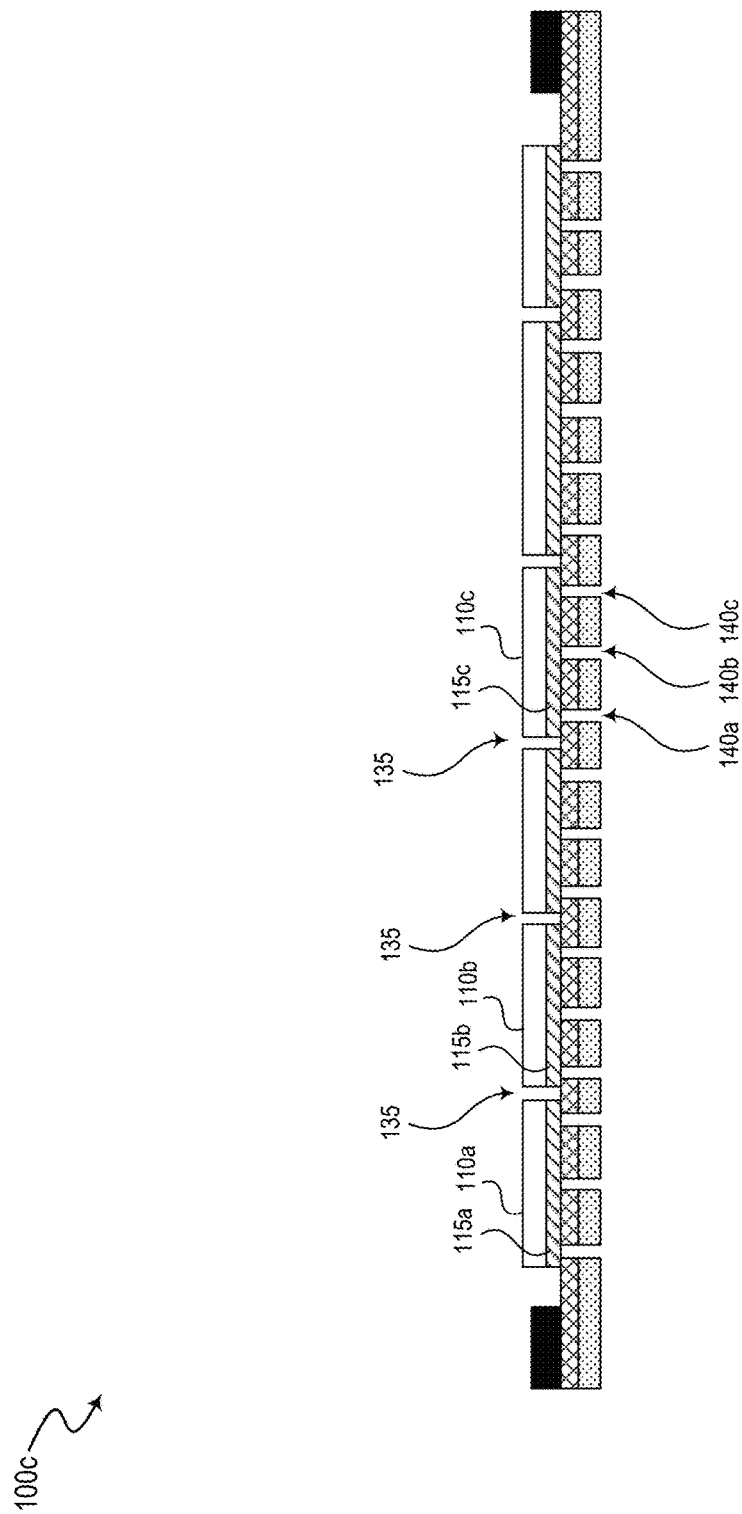

Specific details of several embodiments for releasing thinned semiconductor dies ("thin die release") for semiconductor device assemblies, and associated apparatuses and methods are described below. The thin die release described herein may improve yield or mitigate reliability issues for the thinned semiconductor dies during the dicing process, which in turn, improve yield and reliability performances of the semiconductor device assemblies. The term "semiconductor device or die" generally refers to a solid-state device that includes one or more semiconductor materials. Examples of semiconductor devices include logic devices, memory devices, microprocessors, or diodes, among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

As used herein, the terms "vertical," "lateral," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. A person skilled in the relevant art will also understand that the technology may have additional embodiments, and that the technology may be practiced without several of the details of the embodiments described herein with reference to FIGS. 1A-1D, 2, and 3.

FIGS. 1A through 1D illustrate a process of thin die release (i.e., releasing thinned semiconductor dies from a mount tape) for semiconductor device assembly ("assemblies") in accordance with an embodiment of the present technology. As described herein, the thin die release utilizes a process employing a fluid (i.e., a liquid or vapor) to remove a layer (e.g., a sacrificial layer, which may be an adhesive layer in some cases) disposed between the thin die and the mount tape. That is, in contrast to alternative approaches that apply mechanical forces (e.g., with a pointed structure resembling a needle, in some cases) to separate the thin die from an adhesive layer of the mount tape, the thin die release removes (e.g., dissolves, chemically etches) the sacrificial layer using the fluid (e.g., a chemical solution, a solvent and/or water, depending on the materials included in the sacrificial layer) to release the thin die from the mount tape. As such, the thin die may be ejected from the mount tape without mechanical forces exerted to the thin die (e.g., reducing the risk of die cracks), thereby improving yield or reliability performance of the dicing process. Further, the thin die release may improve a throughput time of the dicing process or decrease thicknesses of the thin dies as the heights of the assemblies shrink.

The thin die release may use a perforated mount tape (which may be referred to as a perforated dicing tape) to inject the fluid through the openings in the mount tape such that the fluid may dissolve (or otherwise remove) a portion of the sacrificial layer located between a target semiconductor die to be released and the mount tape. Further, the thin die release may employ an ejection component configured to selectively dispense the fluid to the portion of the sacrificial layer under the target semiconductor die to be released. In some embodiments, an apparatus may include the perforated mount tape and the ejection component. The apparatus may also include a supporting component configured to lift the target semiconductor die after removing the sacrificial layer between the target semiconductor die and the mount tape.

FIG. 1A illustrates a cross-sectional diagram 100a of a substrate 105 that includes semiconductor dies (e.g., semiconductor dies 110a through 110c depicted in FIG. 1C) fabricated on its front side 106. The substrate 105 may have been thinned from its back side on which a sacrificial layer 115 is disposed (e.g., the back side is coated with the sacrificial layer 115). In some embodiments, a thickness of the substrate 105 may be approximately 50 μm or less. The sacrificial layer 115 may include one or more materials configured to dissolve in contact with a fluid (e.g., solvent, water, or both in a liquid phase or in a vapor phase). In some embodiments, the apparatus may include a coating component configured to form the sacrificial layer 115 on the back side of the substrate 105 that includes the target semiconductor die 110c as depicted in FIG. 1C.

FIG. 1B illustrates a cross-sectional diagram 100b of the substrate 105 with the sacrificial layer 115 mounted on a sheet of mount tape 120. The substrate 105 may be positioned between film frames 133. The mount tape 120 may include a tape adhesive layer 125 configured to attach to the sacrificial layer 115 and a tape backing 130. Further, the mount tape 120 includes a plurality of openings 140. In some embodiments, the mount tape 120 may include the sacrificial layer 115 (e.g., above the tape adhesive layer 125) such that a thinned substrate (e.g., the substrate 105, without the sacrificial layer 115) may be attached to the sacrificial layer 115 when the thinned substrate is positioned onto the mount tape 120. In such embodiments, the sacrificial layer 115 may be adhesive to a surface with which the sacrificial layer 115 comes in contact (e.g., a back side of the substrate 105).

FIG. 1C illustrates a cross-sectional diagram 100c of the substrate 105 with the sacrificial layer 115 mounted on the sheet of mount tape 120, after the substrate 105 is diced through dicing lanes 135. In some embodiments, the apparatus may include a dicing component configured to dice the substrate 105 through the dicing lanes 135 of the substrate 105 to singulate the semiconductor dies 110 from the substrate 105 including the target semiconductor die 110c.

In some embodiments, the dicing component may be configured with a blade to dice the substrate 105 (e.g., blade-dicing). In other embodiments, the dicing component may be configured with a plasma source to perform laser-dicing (which may be referred to as a stealth dicing). In some cases, the sacrificial layer 115 may include materials dissolvable in contact with a solvent when the blade-dicing is used. In other cases, the sacrificial layer 115 may include water-soluble material when the laser-dicing is used. When the substrate 105 is diced, using either the blade-dicing or the laser-dicing, to singulate semiconductor dies 110, debris may be generated on the front side of the substrate 105. In some embodiments, such debris may be collected by a support component (e.g., the support component 150 depicted in the diagram 100d in FIG. 1D).

In some embodiments, the sacrificial layer 115 may be diced together with the substrate 105 as illustrated in the diagram 100c. In other embodiments, the sacrificial layer 115 may be diced partially or remain intact (not shown). The diagram 100c depicts the singulated semiconductor dies 110 (e.g., semiconductor die 110a, semiconductor die 110b, semiconductor die 110c) including a target semiconductor die (e.g., semiconductor die 110c) to be release from the mount tape 120 (i.e., to be released from the tape adhesive layer 125 of the mount tape 120). Further, the set of openings 140 includes multiple openings (e.g., opening 140a, opening 140b, opening 140c) under each semiconductor die (e.g., the target semiconductor die 110c). Some openings under each semiconductor die 110 may facilitate a fluid to be injected to access the sacrificial layer 115 (e.g., the fluid entering into the mount tape 120 via the opening 140b) underneath the semiconductor die 110 while other openings under the semiconductor die 110 may facilitate the fluid to transport the dissolved sacrificial layer (or a by-product of the wet process between the fluid and the sacrificial layer) away from the semiconductor die 110 (e.g., the fluid exiting the mount tape 120 via the opening 140a and/or the opening 140c).

Although the diagram 100c depicts three (or four) openings under each semiconductor die 110, the present technology is not limited thereto. For example, the mount tape may include a greater quantity of openings (e.g., 6, 10, 20, or even more) under each semiconductor die 110 or a lesser quantity of openings (e.g., two (2) openings, one for an inlet and another for an outlet) under each semiconductor die 110. Further, different semiconductor dies 110 of the substrate 105 may correspond to different quantities of openings. In some embodiments, a perforated dicing tape (e.g., a sheet of mount tape 120) may include an overall pattern of the openings that resembles a pattern of semiconductor dies placed on a semiconductor wafer (e.g., a photolithography wafer map). For example, areas with a relatively dense distribution of openings in the perforated dicing tape may correspond to locations of semiconductor dies 110 on the substrate 105. Also, areas with a relatively sparse distribution of openings in the perforated dicing tape may correspond to dicing lanes 135 on the substrate 105. Additionally or alternatively, the openings may include any shape suitable for facilitating a fluid entering and/or exiting the mount tape, such as a circular shape, an elliptic shape, an elongated elliptic shape, a square shape, a rectangular shape, an elongated rectangular shape, or a combination thereof.

Figure 1D:
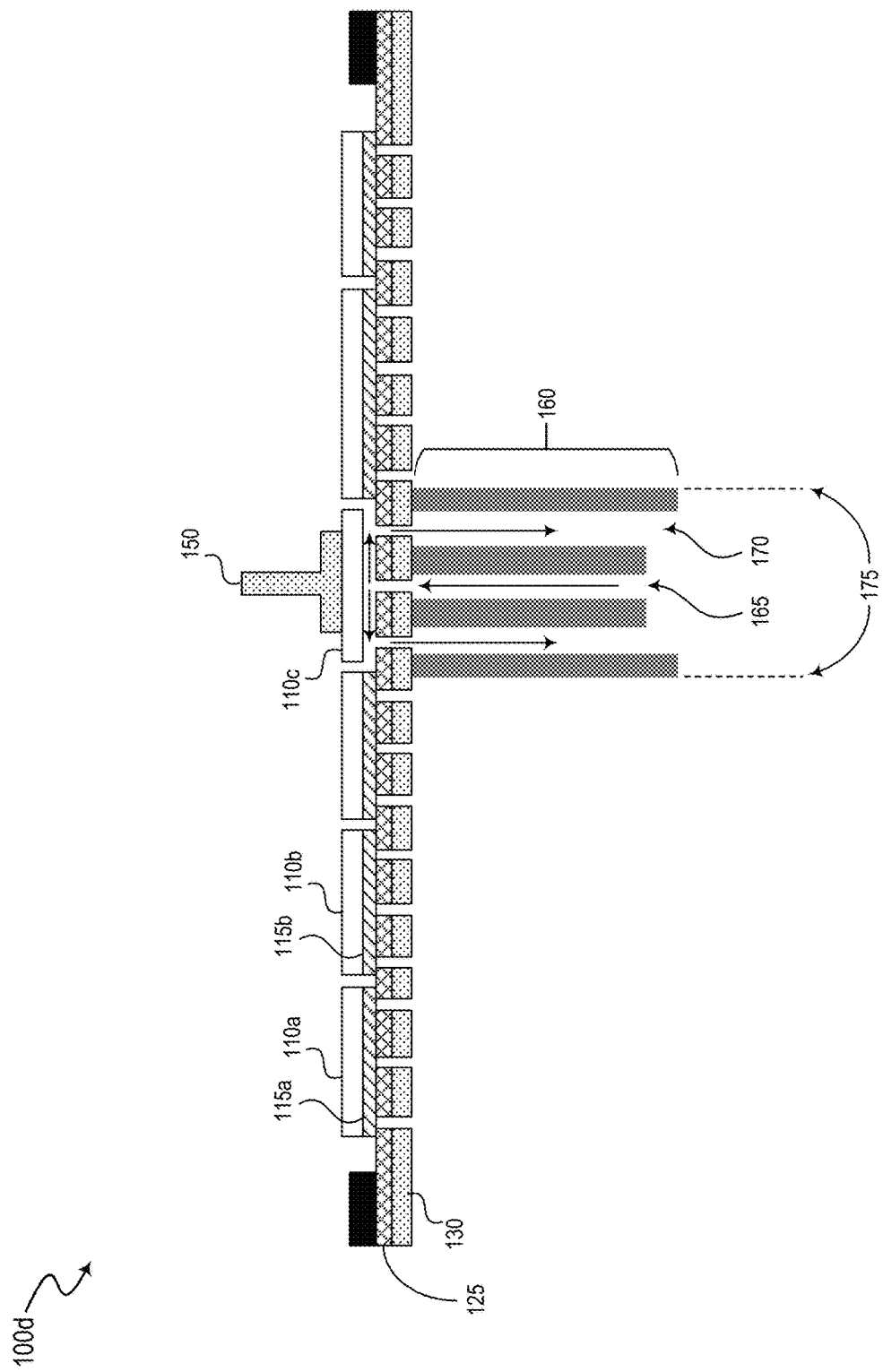

FIG. 1D illustrates a cross-sectional diagram 100d of the substrate 105 diced to have individual semiconductor dies 110 singulated. Individual semiconductor dies 110 are attached to the tape adhesive layer 125 of the mount tape 120 via the sacrificial layer 115, except the target semiconductor die 110c. The diagram 100d depicts that a portion of the sacrificial layer 115 under the target semiconductor die 110c has been removed as described in further details below. The diagram 100d illustrates an ejection component 160 configured to release one semiconductor die (e.g., semiconductor die 110a, semiconductor die 110b, semiconductor die 110c) at a time. For example, the ejection component 160 is positioned under the target semiconductor die 110c in FIG. 1D. The ejection component 160 covers the multiple openings under the target semiconductor die 110c (e.g., openings 140a through 140c). Further, the diagram 100d illustrates a support component 150 configured to buttress (e.g., shore up) the target semiconductor die 110c from the front side 106 of the target semiconductor die 110c.

The ejection component 160 may be configured to apply a fluid toward the sacrificial layer disposed at the back side of the target semiconductor die 110c, and to collect the fluid (and dissolved sacrificial layer) away from the target semiconductor die 110c. That is, the ejection component 160 may be regarded to create a puddle of the fluid in contact with the sacrificial layer to remove, where the puddle is confined to the perimeter of the target semiconductor die 110c. In some embodiments, the ejection component 160 may be configured to dispense the fluid at its central portion and to collect the fluid (and dissolved sacrificial layer) at its peripheral (or edge) portion—e.g., center-dispense and edge-vacuum.

In this regard, the ejection component 160 includes an inlet (e.g., inlet 165) at its central portion. The inlet may be configured to supply the fluid toward the back side of the target semiconductor die 110c via some of the openings the ejection component 160 covers (e.g., opening 140b). As such, the ejection component 160, by injecting the fluid through the mount tape 120, may remove the sacrificial layer (e.g., the sacrificial layer 115c depicted in the diagram 100c) disposed between the back side of the target semiconductor die 110c and the tape adhesive layer 125 of the mount tape 120. As described above, the sacrificial layer 115 includes one or more materials configured to dissolve in contact with the fluid. Further, the ejection component 160 includes an outlet (e.g., outlet 170) at its peripheral portion such that the ejection component 160 may provide vacuum suction through the outlet. The outlet may be configured to collect, through some of the openings the ejection component 160 covers (e.g., opening 140a, opening 140c), by-products (e.g., dissolved sacrificial layer, by-products generated as a result of injecting the fluid toward the sacrificial layer), the fluid, or both. As depicted in the diagram 100d, the peripheral portion of the ejection component 160 may, at least partially, surround the central portion of the ejection component.

Further, the inlet 165 and the outlets 170 may be interchangeable. That is, in some embodiments, the outlets 170 may be used to supply (e.g., dispense, inject) the fluid toward the back side of the target semiconductor die 110c while the inlet 165 may be used to collect the by-products and/or the fluid—e.g., edge-dispense and center-vacuum. Additionally or alternatively, the ejection component 160 may be configured to confine the fluid applied toward the back side of the target semiconductor die within a boundary of the ejection component 160 (e.g., boundaries 175) that correlates to a perimeter of the target semiconductor die 110c. In some embodiments, the ejection component 160 may confine the fluid using the vacuum (e.g., edge-vacuum, center-vacuum) or a sealing at the boundary of the ejection component 160, or both. Additionally or alternatively, the ejection component 160 may push into the tape backing 130 to prevent the fluid from spreading toward other semiconductor dies adjacent to the target semiconductor die 110c.

The support component 150 provides mechanical support for the target semiconductor die 110c such that the target semiconductor die 110c may not fall out from the substrate 105 when the sacrificial layer 115 under the target semiconductor die 110c is completely removed as a result of applying the fluid to the sacrificial layer 115. In some embodiments, the support component 150 may be configured to provide suction to lift the target semiconductor die from the mount tape 120 when the target semiconductor die 110c is released from the mount tape 120—e.g., when the portion of sacrificial layer 115 under the target semiconductor die 110c (e.g., sacrificial layer 115c) is completely removed such that the target semiconductor die 110c is no longer attached to the mount tape 120. In some embodiments, the support component 150 may include a chuck having vacuum suction to pick up the target semiconductor die. In other embodiments, the support component 150 may include an electrostatic chuck (ESC) to pick up the target semiconductor die. In some embodiments, the support component 150 may be further configured to collect debris from the front side of the target semiconductor die 110c, where the debris may be generated as a result of the substrate 105 being diced to singulate the target semiconductor die 110c as described with reference to FIG. 1C. Once the target semiconductor die 110c is released from the mount tape 120 and picked up by the support component 150, the target semiconductor die 110c may be dried with a nozzle configured to apply nitrogen ($N_2$) gas or air.

Figure 2:
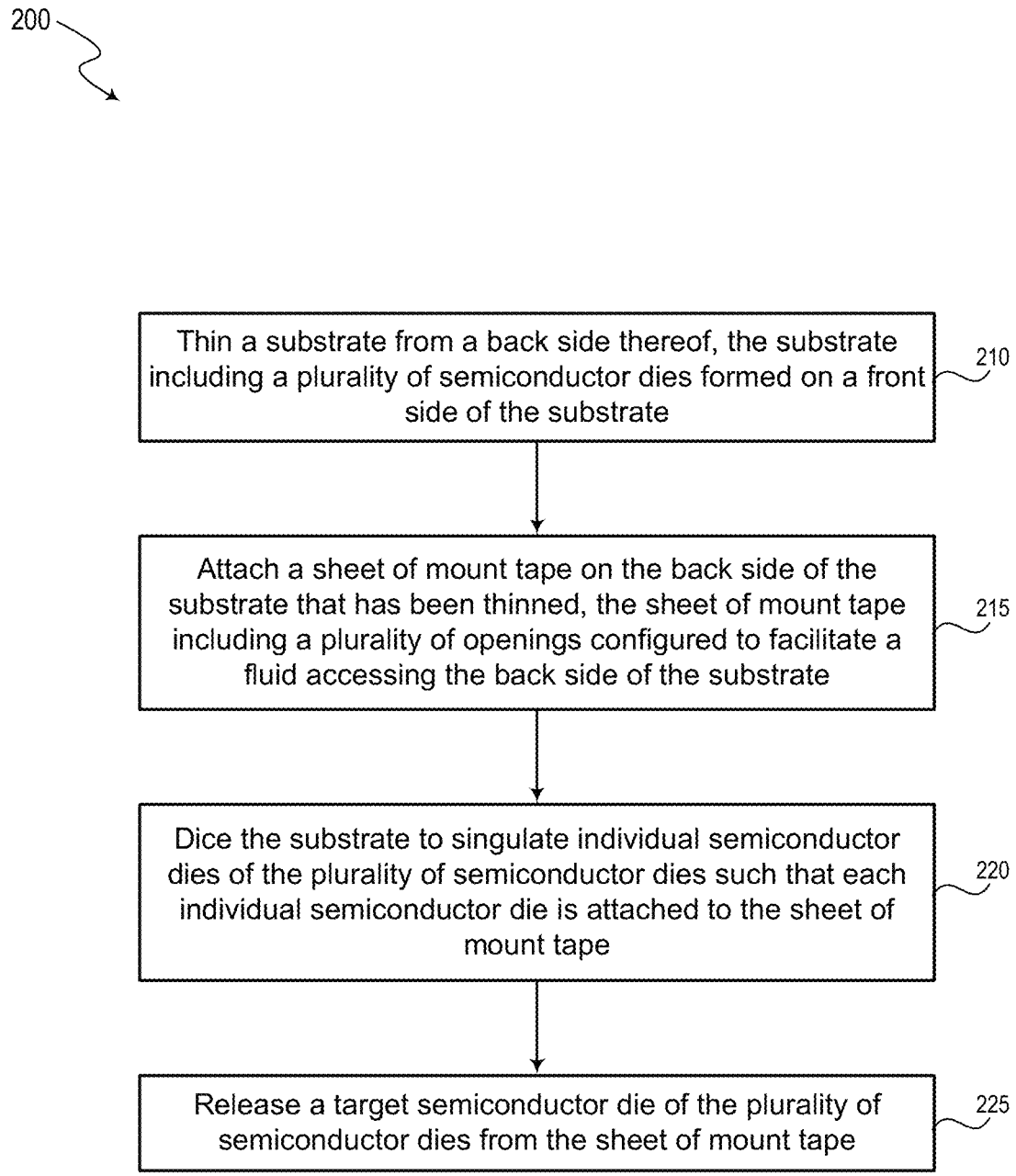
FIGS. 2 and 3 are flowcharts illustrating methods of releasing thin dies for a semiconductor device assembly in accordance with embodiments of the present technology.

FIG. 2 is a flowchart 200 illustrating a method of releasing thinned semiconductor dies for a semiconductor device assembly in accordance with an embodiment of the present technology. The flowchart 200 may include aspects of methods as described with reference to FIGS. 1A through 1D.

The method includes thinning a substrate from a back side thereof, the substrate including a plurality of semiconductor dies formed on a front side of the substrate (box 210). The method further includes attaching a sheet of mount tape on the back side of the substrate that has been thinned, the sheet of mount tape including a plurality of openings configured to facilitate a fluid accessing the back side of the substrate (box 215). The method further includes dicing the substrate to singulate individual semiconductor dies of the plurality of semiconductor dies such that each individual semiconductor die is attached to the sheet of mount tape (box 220). The method further includes releasing a target semiconductor die of the plurality of semiconductor dies from the sheet of mount tape (box 225).

In some embodiments, the plurality of openings includes multiple openings under each semiconductor die of the plurality of semiconductor dies. In some embodiments, the method may further include applying the fluid to the back side of the substrate through multiple openings of the plurality of openings under the target semiconductor die, where the fluid is configured to dissolve a sacrificial layer disposed at the back side of the substrate, and where releasing the target semiconductor die is based at least in part on applying the fluid. In some embodiments, the fluid includes a solvent, water, or both in a liquid phase or in a vapor phase.

In some embodiments, the method may further include confining the fluid applied to the back side of the substrate within a boundary that correlates to a perimeter of the target semiconductor die. In some embodiments, the method may further include collecting, from the back side of the substrate, by-products generated as a result of applying the fluid to the back side of the substrate, the fluid, or both. In some embodiments, the method may further include attaching a support component to the target semiconductor die before releasing the target semiconductor die from the sheet of mount tape. In some embodiments, the method may further include forming, after thinning the substrate, a sacrificial layer on the back side of the substrate, the sacrificial layer including one or more materials configured to dissolve in contact with the fluid. In some embodiments, the sheet of mount tape includes a sacrificial layer configured to attach to the back side of the substrate, where the sacrificial layer includes one or more materials configured to dissolve in contact with the fluid.

Figure 3:
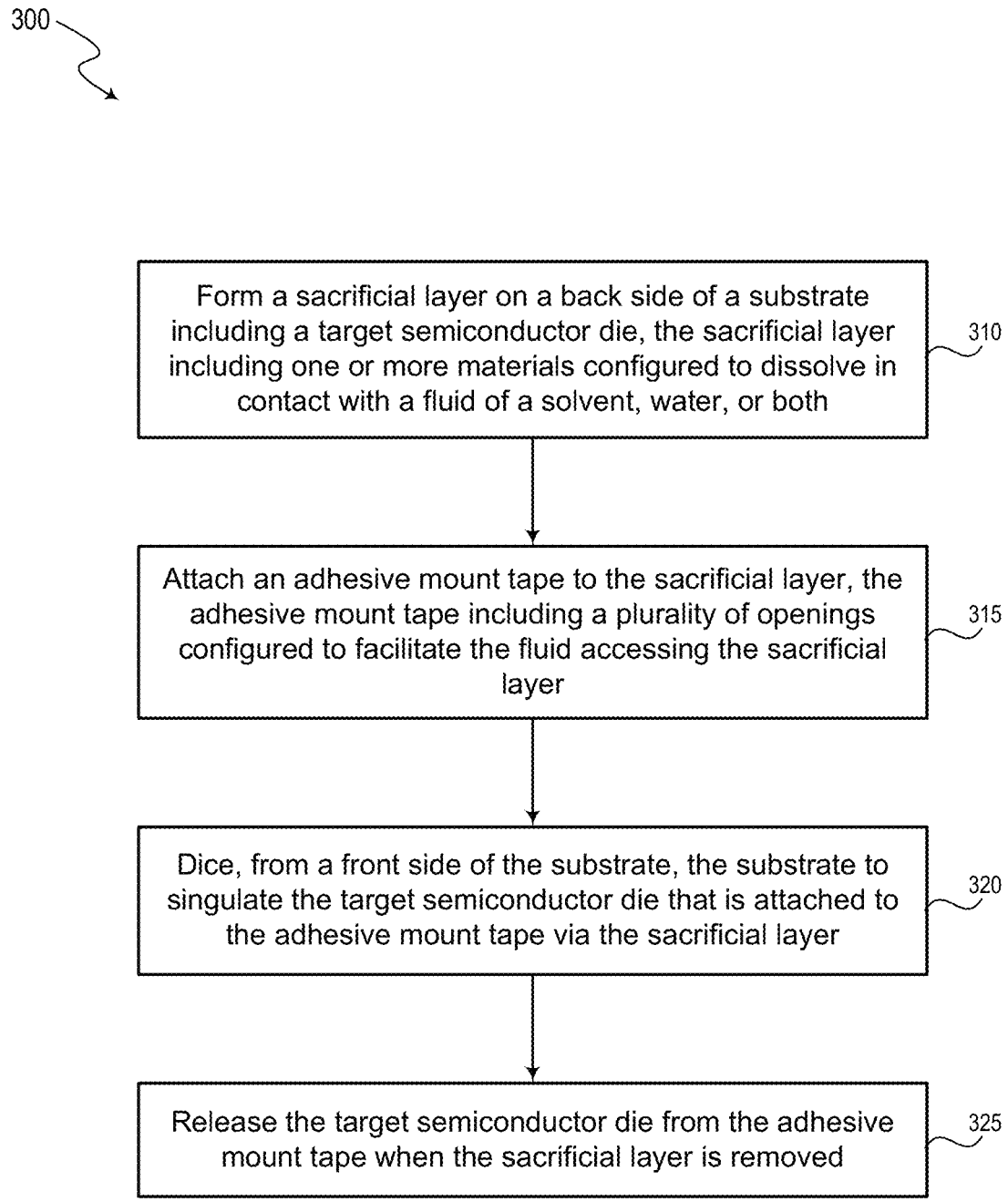

FIG. 3 is a flowchart 300 illustrating a method of releasing thinned semiconductor dies for a semiconductor device assembly in accordance with an embodiment of the present technology. The flowchart 300 may include aspects of methods as described with reference to FIGS. 1A through 1D.

The method includes forming a sacrificial layer on a back side of a substrate including a target semiconductor die, the sacrificial layer including one or more materials configured to dissolve in contact with a fluid of a solvent, water, or both (box 310). The method further includes attaching an adhesive mount tape to the sacrificial layer, the adhesive mount tape including a plurality of openings configured to facilitate the fluid accessing the sacrificial layer (box 315). The method further includes dicing, from a front side of the substrate, the substrate to singulate the target semiconductor die that is attached to the adhesive mount tape via the sacrificial layer (box 320). The method further includes releasing the target semiconductor die from the adhesive mount tape when the sacrificial layer is removed (box 325).

In some embodiments, the method may further include applying the fluid to the sacrificial layer through a subset of openings of the plurality, the subset of openings located under the target semiconductor die. In some embodiments, the method may further include restricting the fluid applied to the sacrificial layer from spreading beyond a boundary that correlates to a perimeter of the target semiconductor die. In some embodiments, the method may further include collecting the fluid and the sacrificial layer dissolved in contact with the fluid, through the subset of openings. In some embodiments, the method may further include providing, from the front side of the substrate, a support component to buttress the target semiconductor die before releasing the target semiconductor die, the support component configured to provide vacuum suction to the target semiconductor die. In some embodiments, the method may further include lifting, using the support component, the target semiconductor die when the target semiconductor die is released from the adhesive mount tape as a result of applying the fluid to the sacrificial layer.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the technology have been described herein for purposes of illustration, but that various modifications may be made without deviating from the disclosure. For example, although the diagram 100d illustrates the ejection component 160 configured to release one semiconductor die at a time (and the corresponding support component 150 that supports one semiconductor die), the present technology is not limited thereto. That is, two or more ejection components 160 may be combined to release two or more semiconductor dies at a time, in conjunction with two or more support components 150. Further, the two or more semiconductor dies may be adjacent to each other or separated from each other.

In addition, while in the illustrated embodiments certain features or components have been shown as having certain arrangements or configurations, other arrangements and configurations are possible. For example, although the diagram 100d depicts the ejection component 160 with one inlet and two outlets, the present technology is not limited thereto. That is, the ejection component 160 may be configured to include more than one inlet and/or any quantity of outlets. Further, the ejection component 160 may be modified to include a different relative positioning of the inlet and the outlet than the embodiment depicted in the diagram 100d without losing its purposes and/or functions within the scope of the present technology. In addition, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus comprising:
 a sheet of mount tape including a set of openings; and
 an ejection component configured to release a target semiconductor die of a plurality of semiconductor dies singulated from a wafer and adhered at a back side to an adhesive layer of the sheet of mount tape, the ejection component comprising:
  an inlet covering a first subset of openings of the set and configured to apply, through the first subset of openings, a fluid toward the back side of the target semiconductor die effective to remove a sacrificial layer disposed between the back side of the target semiconductor die and the adhesive layer of the sheet of mount tape and thereby release the target semiconductor die from the sheet of mount tape; and
  an outlet covering a second subset of openings of the set and configured to provide vacuum suction to collect, through the second subset of openings, by-products generated as a result of applying the fluid toward the back side of the target semiconductor die, the fluid, or both.

2. The apparatus of claim 1, wherein:
the ejection component further comprises a boundary that correlates to a width of the target semiconductor die; and
the ejection component is further configured to:
confine the fluid applied toward the back side of the target semiconductor die within the boundary.

3. The apparatus of claim 1, wherein the ejection component further comprises:
a central portion having the inlet; and
a peripheral portion having the outlet wherein the peripheral portion at least partially surrounds the central portion.

4. The apparatus of claim 1, further comprising:
a support component configured to buttress the target semiconductor die from a front side of the target semiconductor die.

5. The apparatus of claim 4, wherein the support component is further configured to provide suction to lift the target semiconductor die from the sheet of mount tape when the target semiconductor die is released from the sheet of mount tape.

6. The apparatus of claim 4, wherein the support component is further configured to collect debris from the front side of the target semiconductor die, the debris generated as a result of the substrate being diced to singulate the target semiconductor die.

* * * * *